United States Patent [19]

Yates et al.

[11] Patent Number: 5,863,410
[45] Date of Patent: Jan. 26, 1999

[54] PROCESS FOR THE MANUFACTURE OF HIGH QUALITY VERY LOW PROFILE COPPER FOIL AND COPPER FOIL PRODUCED THEREBY

[75] Inventors: Charles B. Yates, Princeton, N.J.; Chintsai T. Cheng, Orange, Conn.; Adam M. Wolski, Edgewater Park, N.J.

[73] Assignee: Circuit Foil USA, Inc., Bordentown, N.J.

[21] Appl. No.: 880,999

[22] Filed: Jun. 23, 1997

[51] Int. Cl.[6] .............................. C25C 1/12; C25D 5/48; C25D 3/38; C25D 1/04

[52] U.S. Cl. ........................... 205/585; 205/77; 205/220; 205/294

[58] Field of Search .............................. 205/77, 220, 296, 205/585, 138; 428/606, 458, 539.5, 935

[56] References Cited

U.S. PATENT DOCUMENTS

| | | | |
|---|---|---|---|
| 3,674,656 | 8/1972 | Yates | 204/13 |
| 3,857,681 | 12/1974 | Yates et al. | 29/195 |
| 4,572,768 | 2/1986 | Wolski et al. | 204/15 |
| 5,215,646 | 6/1993 | Wolski et al. | 205/77 |
| 5,433,840 | 7/1995 | Dahms et al. | 205/296 |

FOREIGN PATENT DOCUMENTS

WO87/03915  7/1987  WIPO.

OTHER PUBLICATIONS

Bunshah et al., "Deposition Technologies for Films and Coatings", 1982, Noyes Publications, p. 396. no month available.

Frederick Lowenheim, "Modern Electroplating", 1974, no month available. John Wiley & Sons, Inc., p. 32.

C.L. Mantell, "Electrochemical Engineering", 1960, pp. 72–73 no month available.

Jack W. Dini, "Electrodeposition The Materials Science of Coatings and Substrates", 1993, pp. 147, 195–236 no month available.

A. J. Kinloch, "Adhesion and Adhesives Science and Technology", 1987, pp. 144, 152–159 no month available.

R. Winand, "Electrocrystallization of Copper", 1975, p. C65 no month available.

William C. Wake, "Adhesion and the Formulation of Adhesives", 1986, pp. 194–195. no month available.

*Primary Examiner*—Arun S. Phasge
*Assistant Examiner*—Edna Wong
*Attorney, Agent, or Firm*—Finnegan, Henderson, Farabow, Garrett & Dunner, L.L.P.

[57] ABSTRACT

An electrolytic process for producing copper foil having a low profile surface exhibiting a high peel strength when bonded to a polymeric substrate, which process comprises: (a) preparing an electrolyte comprising a copper sulfate-sulfuric acid solution, containing as addition agents, a low molecular weight water-soluble cellulose ether, a low molecular weight water-soluble polyalkylene glycol ether, a low molecular weight water-soluble polyethylene imine and a water-soluble sulfonated organic sulfur compound; (b) passing an electric current through the electrolyte from a primary anode to a cathode spaced from the primary anode in a first electrodeposition zone under first mass transfer conditions including a first current density to electrodeposit on the cathode a base copper foil having a fine-grained microstructure and a matte surface having micropeaks with a height not greater than about 150 microinches; (c) passing the base foil and electrolyte from the first electrodeposition zone to a second electrodeposition zone; and (d) passing an electric current through the electrolyte from a secondary anode to the cathode spaced from the secondary electrode in the second electrodeposition zone under second mass transfer conditions including a second current density greater than the first current density and which provide a mass transfer poorer than that in the first electrodeposition zone, while introducing into the second electrodeposition zone a supplemental stream of the electrolyte, to electrodeposit on the matte surface micronodules of copper, so as to produce a copper foil having a total matte height not greater than about 200 microinches. The produced foil can be passed directly to a station for applying a barrier layer, a station for applying a stain-proofing layer and a station for applying an adhesion promoter to the foil.

13 Claims, 9 Drawing Sheets

1000x MAGNIFICATION

BASE FOIL

280 μ"

BASE FOIL & TREATMENT

420 μ"

BASE FOIL WITH SUPERANODE OFF

150 μ"

HIGH-BOND BASE FOIL WITH SUPERANODE ON

190 μ"

1000x MAGNIFICATION

1000x MAGNIFICATION

1000x MAGNIFICATION

5,863,410

PROCESS FOR THE MANUFACTURE OF HIGH QUALITY VERY LOW PROFILE COPPER FOIL AND COPPER FOIL PRODUCED THEREBY

FIELD OF INVENTION

This invention relates to electrolytic copper foil, to a process for producing a very low profile copper foil having a matte surface exhibiting a high peel strength when laminated to a polymeric substrate, and to a laminate using such foil.

BACKGROUND OF THE INVENTION

The production of copper foil for electronic application, i.e., copper-clad laminates for printed circuit boards, consists essentially of two steps; first, electrodeposition or plating, of a "base" or "raw" foil on a rotating drum-cathode and, second, passing the "base" foil through a "treater" machine, in order to provide the matte side of the foil with a bondable surface suitable for bonding to a polymeric substrate. The latter step is sometimes called the bonding treatment. Traditionally, these two operations are separated by the foil manufacturers, since they seem to be mutually exclusive; formation of base foil calls for a concentrated, hot copper sulfate/sulfuric acid electrolyte, in order to yield strong, ductile and compact deposits which form the body of the foil, while the bonding treatment usually requires a more dilute and colder electrolyte which yields fragile, powdery deposits whose role is to enhance the true surface area of the matte side of the foil and thus enhance the bonding ability of the foil.

In a typical process, the first step, fabrication of the base foil, or "core," a primary objective is to impart to the bulk of the foil the combination of physical, metallurgical and electrical properties desired in the printed circuit industry, and obviously, those properties are determined by the microstructure, which in turn is determined by purity and conditions of the plating process. Typical properties of the core of the foil sought by printed circuit board manufacturers are suitable tensile strength, yield strength, elongation, ductility and resistance to fatigue. Many of the desired properties relate to the maximum load the material may withstand before failure, and are usually derived from stress-strain curves. Similarly, electrical conductivity is considered an important property of copper foil. All these properties of copper foil depend on the foil's microstructure, but particularly on the microstructure of the core of the foil. This microstructure, responsible for foil's properties, is in turn determined by the electrodeposition conditions.

Similar to other materials used in high technology applications, copper foil is a composite; i.e., it has a near-surface region with properties differing from those of the bulk material. Thus, the bulk of the copper foil (core) serves in printed circuit boards as the conductor of electricity. The matte side of the foil is responsible for promoting a permanent bond to the polymeric dielectric (insulating) substrate or prepreg, e.g., glass fabric impregnated with epoxy resin.

As shown in FIG. 1, the first manufacturing step utilizes a large cylindrical drum-cathode 20 which rotates, partially immersed in a copper sulfate-sulfuric acid electrolyte 21. The drum cathode is adjacent to and facing toward a pair of curved anodes 22, which may be formed of lead, lead-antimony, platinized titanium, iridium or ruthenium oxides. Both the drum and the anodes are connected electrically by heavy buss-bars 23 to a D.C. power source 24, and currents of up to 50,000 amps or more are commonly used. As the drum rotates in the electrolyte, an electrodeposit of copper forms on the drum surface, and as the latter leaves the electrolyte, the electrodeposited copper is continuously stripped from the rotating drum in the form of thin foil 25, which is slit to size and wrapped around a take-up roll 26. The top or outer surface of the drum is usually formed of titanium.

Foil produced in such a process, prior to being treated, is usually referred to as raw foil. The raw foil is pale pink in color and has two distinctly different looking sides—a "shiny side", the side which was plated onto the drum surface and then stripped is quite smooth while the other side, the side which was facing toward the electrolyte and the anodes, is referred to as the "matte" side, since it has a velvety finish, due to the difference in the growth rate of differing crystal faces during electrodeposition of the "base" foil. The matte side surface, at this stage has a very fine scale micro-roughness and a very specific micro-topography, as shown in FIG. 2. Viewed under high magnification of a scanning electron microscope, it is composed of peaks and valleys. The peaks are closely packed cones or pyramids. The cones' height, slant, packing and shape depend, as is well known, upon closely controlled independent variables of foil thickness, current density, electrolyte solution composition and temperature and the type and concentration of the addition agents in the electrolyte and the like.

In turn, the surface quality (profile) of the matte side of the base foil determines its suitability for the application as a cladding for the laminates destined for fine line circuitry and multi-layer printed circuit boards. The criteria of suitability depends upon the quantitative evaluation of the matte side's surface roughness. A variation which gives useful information about the surface is called "Rz," which is the average deviation from the mean line of the five highest peaks and the five lowest valleys within the roughness sampling length.

The matte side of the base foil provides the basic shape of the foil surface for embedding in the resin of a substrate to promote adhesion in the copper clad laminates used in the manufacture of printed circuit boards (PCB's).

While the matte side of the foil has a certain micro-roughness it is not nearly good enough to satisfy industry need for foil's bondability. This is why copper foil manufacturers have a second manufacturing step in which a surface bonding treatment is applied to the matte side of the base foil. The term "bonding treatment" is universally used to describe the changing of the morphology of the matte side of the base foil to make it suitable for bonding to laminate resins.

The bonding treatment operation is conducted in machines called "treaters" wherein rolls of raw foil are unrolled in a continuous manner and fed into the treater by means of driven rollers (similar to the way in which a web of paper is handled in a printing machine), rendered cathodic by means of contact rollers and passed in a serpentine fashion through plurality of plating tanks, facing, in each tank, a rectangular anode. Each tank has its own supply of appropriate electrolyte and its D.C power source. Between the tanks the foil is thoroughly rinsed on both sides. The purpose of this operation is to electrodeposit on at least one side of the foil, usually the matte side, microprojections of complex shape which ensure that the foil will be firmly anchored to the base polymeric materials used in fabricating the copper clad laminates.

High peel strength (the force necessary to pull apart the copper foil and the supporting insulating substrate material)

is a characteristic of the highest importance, since the mechanical support of the circuit elements, as well as the current carrying capability of PCB's, is provided by the copper foil—polymer joint. It is essential that the foil is bonded very tightly and securely to the substrate and also that such an adhesive joint can withstand all the manufacturing steps in PCB's fabrication without the decrease of the initial adhesion, which, moreover should remain constant throughout the service life of the PCB.

This bonding operation is carried out in laminating plants and involves heating and cooling cycles. Sheets of copper foil are laid upon sheets of "prepreg" (e.g., glass fabric impregnated with epoxy resin). Both materials are placed in a hydraulic press having heated pressing plates, and the two materials are pressed together under high pressure. At elevated temperatures in the resin liquefies and is forced, by the pressure, to flow into the micro-irregularities of the foil surface. This is followed with a second cycle, when both materials are cooled, while the pressure is being maintained, the resin solidifies in the irregularities of the foil surface, and both materials are firmly bonded together and very difficult to pull apart. It is the responsibility of the matte side of the foil to ensure high peel strength.

The matte side of the finished foil, i.e., the base foil plus treatment, refers to the combined effect of the microtopography of the matte surface of the base foil (electrodeposited at the drum machine) and the bonding treatment plated upon that surface at the treater machine. Both are equally important.

The preferred bonding treatment is effected by subjecting the matte side of the base or "raw" foil to four consecutive electrodeposition steps. The first consists of the deposition of a microdendritic copper layer which enhances, to a very large degree, the real surface area of the matte side, and thus enhances the foil's bonding ability. It is followed by electrodeposition of an encapsulating, or gilding, layer the function of which is to mechanically reinforce the dendritic layer, and thus render it immune to the lateral shear forces of liquid resins in the laminating stage of the PCB's fabrication. Then, a so-called barrier layer is deposited on the dual-layer copper treatment, after which a stainproofing layer is applied.

The purpose of the dendritic deposit is to increase the "true" surface area of the matte side since that property is ultimately responsible for the bonding characteristics of the foil. The shape, height, mechanical strength and the number of dendritic microprojections per surface area which constitute dendritic deposit are the factors instrumental in achieving adequate bond strength of the foil, after all stages of the treatment are completed. The dendritic deposit, the first stage of the treatment, is relatively weak mechanically and given to unacceptable treatment transfer characteristics.

The encapsulating step of the treatment is very important, since it eliminates the foil's tendency toward "treatment transfer" and the resulting "laminate staining" which can cause the decrease of the laminate's dielectric properties. The role of this second treatment stage, is to mechanically reinforce the fragile dendritic layer, by overplating it with a thin layer of sound and strong metallic copper, which locks the dendrites to the base foil. Such a dendrites-encapsulation composite structure is characterized by high bond strength and the absence of treatment transfer. The treating parameters which assure just that are relatively narrow. If the amount of the gilding deposit is too low, the foil will be given to treatment transfer. If, on the other hand, the gilding layer is too thick, a partial loss of peel strength may be expected. These first two layers of the treatment are composed of pure copper, in the form of microscopic, spherical micro-projections.

The dual-layer copper bonding treatment may have electrodeposited thereon a very thin layer of zinc or zinc alloy, a so-called barrier layer. During the fabrication of copper clad laminates destined for PCB's, the zinc-containing layer alloys with the underlying all-copper bonding treatment by the process of heat-accelerated diffusion of metals in the solid state. As a result, a layer of chemically stable alpha brass is thus formed over the surface of the all-copper treatment. Its purpose is to prevent direct copper-epoxy resin contact, and this is why the zinc-containing layer (which during lamination is converted to alpha brass), is referred to as a barrier layer. If the bonding treatment were composed of copper only and subjected to lamination with epoxy resin systems, it tends to react with amino groups of the resin, at the high laminating temperatures. This, in turn, may create moisture at the foil-resin interface, causing the harmful effect of "measling", and possibly delamination. The barrier layer plated over the all-copper bonding treatment prevents these harmful effects.

All three stages of the treatment mentioned above, as is well-known in the art, are effected by means of electrodeposition for the purpose of changing the geometry and morphology of the matte side of the foil and assure the mechanical strength of the surface region. (U.S. Pat. No. 3,857,681, Yates et al.)

The foil treated as described above may then be subjected to an electrochemical stainproofing which changes the surface chemistry. As a result of this step, the bonding surface is rendered chemically stable. This stainproofing operation removes weak surface films, which can greatly decrease the adhesion of the foil to the substrate, and provides a stable film of controlled thickness, responsible for imparting on the treated surface "durability" of its properties.

FIG. 9 illustrates a typical bonding treatment (deposited over the matte side of the base foil shown on FIG. 2) and shows clearly that the disideratum of high bondability of the foil is achieved through the increased micro-roughness of the foil and the complex shape of the particles of the bonding treatment.

Typically, the Rz of e.g. 280 micro inches of the base foil increases to the value of e.g. 420 microinches after the application of the bonding treatment, because the micro-peaks of the foil offer a favorable geometry for the rapid supply of the ions, by diffusion, in the course of the treating process. This effect is illustrated in FIGS. 3(A) and 3(B).

Since the bonding treatment is plated over the matte side of the base foil, with its micro-profile of peaks and valleys, the treatment is plated preferentially over the peaks. The diffusion layer in the electrolytes employed in the treatment process cannot follow the contour (profile) of peaks and valleys. Thus, mass transfer to the peaks is easier and the current density distribution follows suit according to the rules of mass transfer.

Peaks are thus "overcrowded" with the bonding treatment at the expense of the valleys. This is an undesirable condition of so-called poor micro-throwing power.

Treatment with overly high micro-projections concentrated on the peaks of base foil is a poor raw material for fabrication of printed circuits. The cross-section of the foil is chain-saw like, with "teeth" that penetrate very deeply into polymeric substrates. Consequently, it increases the time necessary to etch away unwanted copper, the particles of copper tend to remain deeply embedded in the resin, affecting unfavorably dielectric properties of printed circuit boards and diminishing layer to layer dielectric thickness in the fabrication of multi-layer printed circuit boards. Obviously, a reverse of described condition, a good micro-throwing power, is desirable, in the electrodeposition of bonding treatment. It is achieved, if the treatment's microprojections, instead of overcrowding micropeaks, descend deeper toward the micro-valleys.

Good bonding ability is achieved not by excessive height of the treatment at the peak, but by better distribution of the individual treatment particles (microprojections). If the height of microprojections is decreased, but their number increases, the bonding ability of the foil will remain the same, but foil will be endowed with more desirable characteristics, namely low profile.

Metallographic cross-sectioning of the copper foil clearly illustrates the reference to the foil's profile. Obviously, a foil's two opposing surfaces are not the same. While the surface formed next to the drum, the shiny side of the foil, even when viewed under great magnification, is relatively flat and smooth, the matte side of the foil comprises the micro-peaks and micro-valleys of the base foil with the bonding treatment, in the form of spherical microprojections, plated over micro-peaks and micro-valleys and concentrated especially over the micro-peaks. Thus, it can be clearly seen that copper foil has a "core" (a solid body of dense metal) and a "tooth", a chain-saw like dense coating of microprojections composed of micro-peaks of base foil and the bonding treatment. According to this convention, typical copper foils offered by the manufacturers of electrodeposited copper foil can be classified as (a) very low profile (Rz of bonding surface of 1 ounce foil e.g., combined roughness of the matte side of the base foil and the bonding treatment must not exceed 200 microinches), (b) low profile foils, when Rz should not exceed 300 microinches, and (c) so called "regular" foils, when the foil's profile can be higher.

Only the first two categories are generally used for the fabrication of multilayer boards. Naturally, that raises the question how to determine the gauge of copper foil destined for electronic application—the weight per unit of surface area versus the actual thickness. The former is most often used, and foil weighing one ounce per one square foot is called one ounce foil (1 oz.).

Such designation is now considered not adequate by the designers of electronic circuits and equipment, since the mass or the thickness of the "core" is pertinent in assessing the gauge (from the electrical viewpoint) of the foil, while the "tooth" is not.

Thus, it is now believed that the foil is better characterized by its thickness, measured by micrometer, since it takes into account the profile (cross-section) of the foil and the ratio between thickness of the core and the matte height, or the "tooth" (combined matte height of the foil and the treatment).

Since micrometer measurement includes peaks of the base foil and the peaks of the treatment upon them, a foil with a pronounced matte side of the base foil and with a large amount of treatment will be thicker than a foil with a less pronounced base foil matte structure and a lesser amount of the treatment, even if the weight areas of both foils are the same. The thickness of 1 oz. foil can be as different as 1.8 mil and 1.4 mil. The industry trend is toward "thinner" foils in these terms. Such foils are referred to as "low profile". Foil with a rectangular cross-section would be considered ideal, theoretically, if the foil's bonding ability were not an important consideration. However, it is widely agreed that the matte height of the foil should not exceed 15% of the total thickness of the foil. Only such foils are desirable for use in fabrication of multi-layer boards, the most advanced and fastest growing segment of printed circuits industry.

Matte height is routinely measured by copper foil manufacturers and users, with a stylus type instrument which measures peak to valley amplitude. The trend toward the use of low profile foil in electronic applications represents a very serious dilemma to the foil manufacturers, since the users of copper foil are unwilling to lower their requirements in regard to peel-strength (bondability) of the foil, while insisting on the necessity of lower profile foil.

It is self evident that both the micro-roughness of the base foil (Rz of peak and valleys) and the bonding treatment contribute toward the profile (roughness) of the finished foil.

Traditionally, it has been understood that the rough matte side of the base foil (high Rz) followed with the high amount of the bonding treatment delivers the highest possible peel-strength, while the foil made in such manner is also characterized by high roughness (high profile, high Rz).

Clearly, the two of the printed circuit industry's most important requirements in regard to the characteristics of copper foil: good peel-strength, and low profile, are in conflict in terms of traditional foil fabrication concepts and practice. Therefore, it would be highly desirable to have commercially available an economical process for producing high quality copper foil having both a very low profile surface and a high peel strength.

A primary object of the present invention is to provide an improved process for high quality copper foil having a very low profile treated surface which has a high bond strength when laminated to a polymeric substrate, as well as a copper foil produced by such process and a copper clad laminate made with such foil. Other objects may become apparent from the following description of the invention and from the practice of the invention.

SUMMARY OF THE INVENTION

To achieve the objects of the present invention there is provided an electrolytic process for producing copper foil having a very low profile surface exhibiting a high peel strength when bonded to a polymeric substrate, which process comprises: (a) preparing an electrolyte comprising a copper sulfate-sulfuric acid solution containing, as addition agents, minute amounts of a low molecular weight water-soluble cellulose ether, a low molecular weight water-soluble polyalkylene glycol ether, a low molecular weight water-soluble polyethylene imine and a water-soluble sulfonated organic sulfur compound; (b) passing an electric current through the electrolyte from a primary anode to a cathode spaced from the primary anode in a first electrodeposition zone under first mass transfer conditions including a first current density to electrodeposit on the cathode a base copper foil having a fine-grained microstructure and a matte surface having micropeaks with a height not greater than about 150 microinches; (c) passing the base foil and electrolyte from the first electrodeposition zone to a second electrodeposition zone; and (d) passing an electric current through the electrolyte from a secondary anode to the cathode spaced from the secondary electrode in the second electrodeposition zone under second mass transfer conditions including a second current density greater than the first current density and which provide a mass transfer poorer than that in the first electrodeposition zone, while introducing into the second electrodeposition zone a supplemental stream of fresh electrolyte, to electrodeposit on the matte surface micronodules of copper, so as to produce a copper foil having a total matte height not greater than about 200 microinches.

The present invention also provides a copper foil produced by the above process, and a copper-clad laminate, wherein such foil is laminated to a polymeric substrate, suitable for the manufacture of PCB's. The present invention also provides a one-step process for producing such a foil having applied to the matte side thereof a barrier layer and a stain proofing.

BRIEF DESCRIPTION OF THE DRAWINGS

The accompanying drawings, which form a part of the specification, illustrate the preferred method and apparatus for the practice of a preferred embodiment of the present invention and copper foil in accordance with the invention, and in conjunction with the herein-provided description of the invention, serve to explain the principles of the invention. In the drawings.

DESCRIPTION OF PREFERRED EMBODIMENTS OF THE INVENTION

Figure 1:
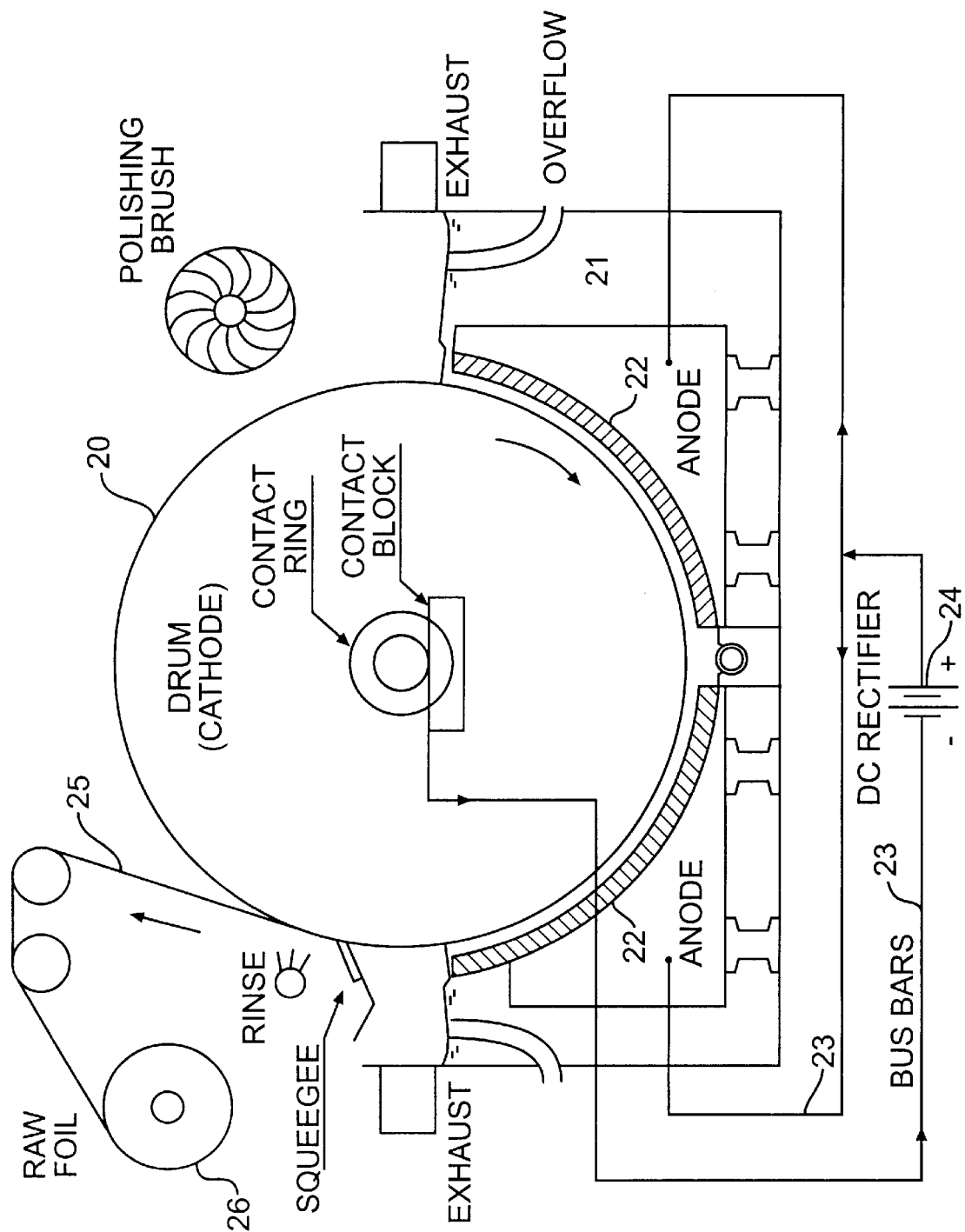
FIG. 1 depicts a conventional drum-cathode machine.

The crystal structure of electrodeposited copper is strongly dependent on the relative rates of crystal nuclei formation and the growth of existing crystals, with finer grained deposits resulting from conditions favoring crystal nuclei formation, while larger crystals result from conditions favoring growth of existing crystals.

In the present electrodeposition process the effect of individual variables can act in either opposite or the same directions. Because the process variables that affect mass transfer (current density, copper ion concentration, type and concentration of addition agents, electrolyte temperature, degree of agitation) are not of the same order of magnitude, their effect can be cumulative and interdependent. Thus, by proper control of these variables one can achieve out of the same electrolyte, the microstructure of the electrodeposit that is the best for the properties required of the "core" of the base foil and the micro-topography of the matte side of the base foil that is best for foil's bondability.

Electrocrystallization (crystal habit) of electrodeposited metal is affected by the mass transfer of the metal ions to the cathode. In turn, this mass transfer can be characterized by the ratio of the current density and the bulk concentration of the metal ions —C—. Conversely, the ratio of current density (J) and the limiting current density (also called diffusion limiting current density Jdl) is also used to quantify mass transfer.

$$\frac{J}{Jdl} = \frac{V \times \delta}{n \times F \times D} \times \frac{J}{C}$$

V—Stoichiometric Coefficient of Cu++

$\delta$—Diffusion layer thickness n—Number of electrons involved in cathode reaction (2 for copper)

F—Faraday's constant

D—Diffusion Coefficient of metal ions

A shift from one type of electrodeposit's structure to another type of structure can be achieved by shifting J/Jdl ratio, or J/C ratio.

The influence of the additives or addition agents on the microstructure of the base copper is a very significant feature of the present invention. Small concentrations of addition agents produce inhibiting effects on active growth sites. Additives can be classified into four major categories: grain refiners, dendrite and roughness inhibitors, leveling agents and brightening agents.

The interaction between certain, empirically selected additives and the two magnitudes of current densities permits the manufacture of base copper foil whose "core" is very fine-grained and whose matte side is composed of minute microprojections, which due to their number and shape, not an individual height, offer excellent "bondability".

At constant inhibition, with the increasing current density, the thickness of the growth layers increases, but their number present at the same time at the surface of the crystal decreases. On the other hand, at constant current density, but increasing inhibition, the thickness of the growth layers decreases, whereas their number present at the same time at the surface of the crystal first increases and then decreases.

We believe that organic addition agents influence electrodeposition by processes of adsorption or selective blocking of the growth sites and thus are able to alter growth patterns and microstructures of the electrodeposits.

Formation of complex compounds between addition agents and the metal of the electrodeposit is also thought to be a mechanism by which addition agents influence a deposit's structure and through it the surface characteristics and the morphology of the deposits.

Wetting abilities of the addition agents and thus their influence on the interfacial tension is also considered to be responsible for the ability of addition agents to influence electrodeposition processes.

The influence of addition agents on the surface characteristics of the matte side (bonding side) of the foil are the central focus of this invention since the matte side of the foil is responsible for foil's "bondability".

The desideratum is to combine good bondability with the low profile (roughness) of the bonding surface. The term "surface characteristics" refers to surface roughness and can be evaluated quantitatively by measuring peaks-to-valleys amplitude as well as the number of peaks per surface area.

Microscopic evaluation (by scanning electron microscope) of the bonding surface adds information on peaks shape (for instance, peaks can have the shape of sharply defined cones or pyramids as opposed to rounded top hills), which determines the sharpness and definition of the bonding sides surface. This determines a foil's bondability, since as discussed previously, interlocking between a foil's bonding side and the polymeric substrate is responsible for peel strength or bond-strength in copper clad laminates used in printed circuits industry. The flow of the resin into the micro-irregularities of the foil surface provides the anchoring effect between the two materials. The shape, depths and number of these surface irregularities per surface area are extremely important factors in determining foil's bondability.

Earlier we have discussed the micro-topography of the matte side of the foil and said that is composed of peaks and valleys. The peaks are closely packed cones or pyramids.

In a typical one ounce copper foil produced with the aid of traditional addition agents like gelatin, the matte side of the foil has about $6.5 \times 10^6$ peaks per square inch and the average peak height is about 8 microns or 320 microinches and the distance from peak to peak is about 10 microns. Such base foil, after the application of bonding treatment has a good peel-strength of about 12 lbs/inch, but because the roughness of the bonding side exceeds 10 microns, the foil can not be used in the manufacture of multi-layer printed circuit boards, which require low profile foils.

We recognized that the peak count of the traditional copper foils, even if one disregards the failure to meet low profile criteria, is not necessarily optimal from the view point of attaining the highest possible peel strength, since the bonding surface of traditional foils provide a relatively low number of quite deep "surface irregularities" for the resin to flow into and then solidify. Further, we recognized that if the number of peaks per surface area is substantially increased but peaks height decreased, the peel-strength requirement could be still satisfied, and the low profile criteria could be met as well.

By empirical experimentation with different types of organic addition agents, we have been able to fulfill these requirements and produce one ounce foil whose matte side is composed of well defined, "sharp" peaks, about $4 \times 10^7$ peaks per square inch, with the average peak height not exceeding 4 microns, and the distance from peak to peak also being 4 microns. Such foil, after the "bondability" step provided in the second electrodeposition zone, has a peel-strength of about 12 lbs/inch, but its micro-roughness does not exceed 5 microns (200 microinches), and thus it meets the criteria of "very low profile foil".

Our choice of the addition agents for the production scale experiments aimed at combining the low profile aspect of the foil's bonding surface with the high peel-strength, was based on the concept of preferential adsorption. Adsorption can be described as the adherence of the molecules to the surface of another substance. Finely divided or microporous materials presenting a large area of active surface, for instance, the matte side of copper foil, are good adsorbents. It is believed that in general, the attractive force of adsorption is relatively small, although it varies depending on the nature of the substance.

When molecules of two or more substances capable of being adsorbed are present in the copper plating electrolyte, the molecules of one substance can be adsorbed at the interface of the two phases, more readily than the molecules of other addition agents. A competition between different species of addition agents for the adsorption on the active growth sites of the matte surface of the foil is thus established.

Surprisingly, we have found that a mixture of four different, specific species of addition agents, each of which is present in the electrolyte in a minor, but effective amount, enables the manufacture of copper foil endowed with the desirable micro-topography of the bonding side of the foil, which micro-topography is impossible to attain with the aid of just one or even two addition agents. We believe that this is due to the synergy of the four preferred types of addition agents resulting probably from dynamic processes of preferential adsorption-desorption that takes place in the course of electrodeposition.

We have found it to be important that the above four species of addition agents are selected from the following classes of chemicals:

1. Water soluble polymers derived from purified cellulose as a starting material. Among commercially important polymers of that type, are carboxymethylcellulose, methylcellulose, hydroxypropylcellulose, etc. We have found hydroxyethylcellulose (HEC) to be most useful as an addition agent. HEC is a non-ionic hydrocolloid and we believe that its ability to act as a protective colloid (adsorption, film formation, moderate surface activity) makes it a useful and versatile addition agent in the electrodeposition of copper foil.

2. Polyethylene glycols (PEG):

These are wholly synthetic, water soluble polymers in the form of linear chain of ($-CH_2CH_2O-$) units with hydroxyl group at each end. If the hydroxyl groups on each or both ends are replaced with, for example, methyl groups, the polymer will be called polyethylene glycol monomethyl ether, or polyethylene glycol dimethyl ether.

Polyethylene glycols possess unusual solvency properties (for instance, some metal salts, including cupric salts, can be dissolved in PEG at about 100° C. and remain stable upon cooling to room temperature), are highly hyrophilic and capable of lowering surface tension.

We have found that PEG is very helpful in allowing the remaining three addition agents to complement each other's action, rather than work at cross-purposes. Specifically, micro-topography of the matte side of copper foil manufactured with PEG is much more uniform than without PEG.

Our preferred polymer of this class is polyethylene glycol dimethyl ether m.w. 2000.

3. Polyethleneimine (PEI):

PEI ($-NH-CH_2-CH_2-$) n is a polyamine polymer, and is a very potent addition agent in the electrodeposition of copper, because it combines the ability to adsorb by virtue of its attraction to the electronegative surfaces with the ability to form complex compounds with copper due to the presence of amino nitrogene in its molecule.

The primary function of PEI as an addition agent is its ability to promote very "sharp" definition of the peaks (sharp tips, pronounced ridges, as opposed to rounded, smooth peaks) in the micro-topography of the matte side of copper foil. In turn, this sharp definition assures good interlocking with the polymeric substrates, and thus good bondability.

4. Water soluble, sulfonated organic sulfur compounds:

Such compounds often form complex salts with metals, which is helpful in formation of stable interfacial films.

As an example, 2-mercaptobenzothiazole (MBT) due to its ability to react with copper, with the resulting formation of protective films, found an extensive use as a corrosion inhibitor in recirculating cooling water systems, to protect copper and copper alloys.

Many simple bivalent sulfur organic compounds posses similar ability and thus be useful as addition agents in electrodeposition of copper.

These substances can belong to the group of aliphatic thiols, R—SH (also known as mercaptans), sulfides $R^1$—S—$R^2$, disulfides $R^1$—S—S—$R^2$, as well as aromatic and heterocyclic thiols, sulfides and disulfides.

Such substances have, usually, non-polar and hydrophobic molecules. To make them useful as addition agents in electroplating they are sulfonated, i.e. sulfonic acid group $SO_3H$ is introduced into the structure of a molecule in place of a hydrogen atom.

As a result, the molecule of a chosen thiol is rendered soluble in copper plating electrolyte and becomes polar and hydrophilic.

Our preferred sulfur compound is sodium salt of mercaptoethane sulfonic acid (MES). In the presence of the three addition agents 1., 2., and 3., described above, MES is instrumental in dramatically increasing the number of peaks and decreasing their height, in the micro-topography of the matte side of the foil.

Interestingly, without the "support" of the first three categories of addition agents described above, mercaptoethane sulfonic acid alone has no influence on the micro-structure of copper foil.

We have observed from the results of our work how the four classes of addition agents act if not all four are present together in the copper plating electrolyte.

Hydroxyethyl cellulose, compared for the purpose of and example, with gelatin, is instrumental in producing micro-topography of the matte side of the foil with a very low peak-count (number of peaks per surface area), while reducing the peaks height. Although the peaks are low and could qualify for low profile foils, the shallow slopes of the peaks and their low number per surface area, offer poor anchoring to the polymeric substrates, with a peel-strength of only 7 to 8 lbs/inch for one ounce foil.

The addition of mercaptoethane sulfonic acid to the electrolyte that contains hydroxyethyl cellulose increases the number of peaks per surface area, peak height remains low, but the peaks are in fact not peaks but rounded hills with the smooth tops, quite devoid of sharp definition. Consequently, the peel-strength remains low, about 8 lbs/inch.

Introduction of polyethyleneimine into the electrolyte changes dramatically the microtopography of the matte side. The peak count per surface area remains high, the peak height remains low, but the form of the individual peaks becomes well defined, pointy and sharp, resulting in drastically improved peel-strength—between 11 and 12 lbs/inch. However, the structure of the matte side lacks regularity, on a micro-scale. Some peaks are higher than others and the spacing of the peaks is not quite equal. The addition of polyethylene glycol compound improves homogeneity of the micro-structure and the micro-topography of the matte side becomes uniform, conforming to the requirements of low profile, good peel-strength and good appearance on both visual and microscopic scale.

We have assumed for the purpose of the present invention that we wish to preserve the micro-topography of the matte side of the base foil micro-structure that is composed of peaks and valleys, while willing to "negotiate" the size (height) of the peaks their slope, and density (packing).

Certain addition agents that, added to the copper foil plating electrolyte, will provide a relatively smooth surface of the matte side by either obliterating the micro-peaks, or rendering the slope of the peaks much less steep. In both cases the lower profile would result in the desired effect, but the bondability of the foil would inevitably suffer.

We ran an extensive number of production scale experiments, using the chemicals, especially water soluble polymers known to be active in electrodeposition, with the aim of producing low profile foil without compromising foil bondability.

Based on our work we selected the above four types of the addition agents which when used as a blend in specific ratios and specific individual concentrations in copper plating electrolyte enable the manufacture of very low profile foil with good bondability.

The selected types of the addition agents used in the present invention were:
  cellulose ethers, low molecular weight
  polyalkylene glycols, low molecular weight
  polyethylene imine, low molecular weight
  sulfonated organic sulfur compounds, either aliphatic or aromatic Copper foil electrolyte used for the manufacture of base foil with these four addition agents present at appropriate concentrations, yields base foil whose matte side is characterized by very low profile and the potential bondability remains good because due to the influence of these specific additives on the foil's structure, although the height of individual peaks is decreased their number per surface area is increased dramatically and the potential bondability does not suffer since every peak offers a potential anchorage to the polymeric substrate.

Figure 4:
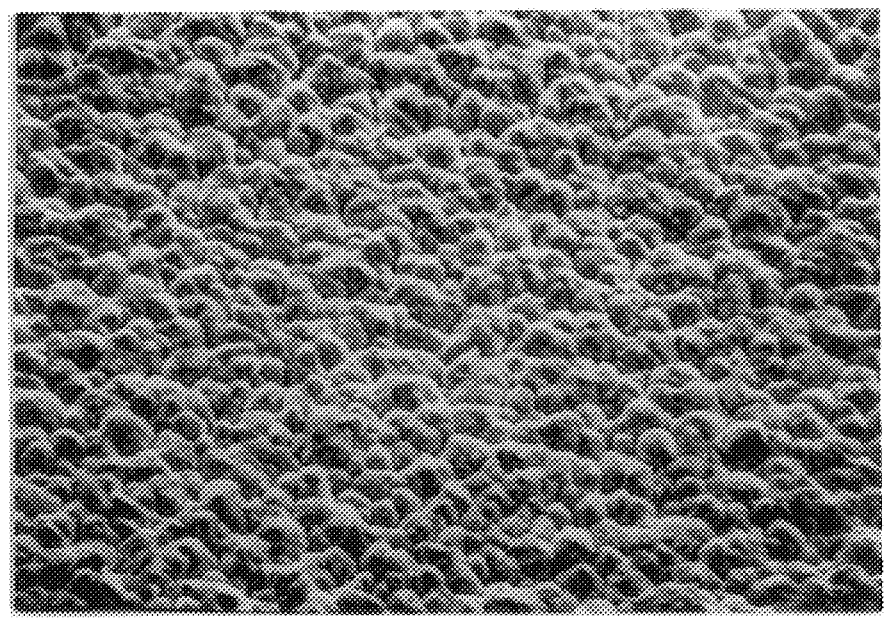
FIG. 4 is a microphotograph of the matte-side of copper foil produced on a conventional machine using an electrolyte containing the blend of addition agents of the present invention.

FIG. 4 is an actual SEM photograph (1000× magnification) of the matte side of the base foil produced on a conventional rotating drum machine, using a plating electrolyte with the blend to addition agents of the present invention.

We then decided to produce base foil using the electrolyte with the addition agents of the present invention on a so-called "super-anode" rotating drum machine, which includes a secondary anode positioned above a terminal portion of the primary anode on the exit side of the machine. Such a super-anode machine is described in U.S. Patent Nos. 3,674,656 and 5,215,646, both of which are incorporated herein by reference.

Figure 5:
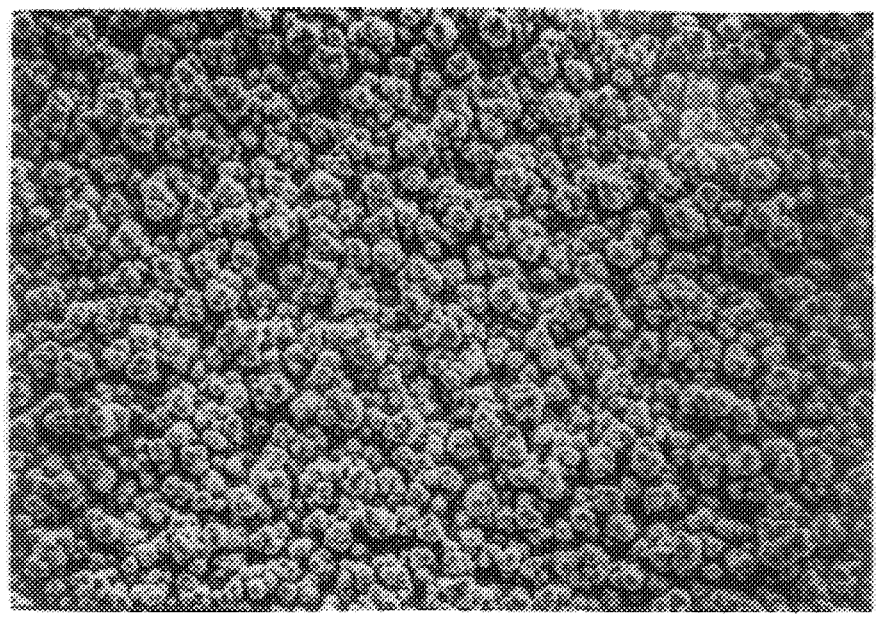
FIG. 5 is a microphotograph of the matte side of new foil produced in accordance with a preferred process of the present invention.

To our astonishment, the resulting base foil had still a low profile, but the peel-strength of the base foil was as high as a typical peel strength of the base foil provided with the bonding treatment at the treater machine. FIG. 5 is a SEM photograph (1000× magnification) of the matte side of this resulting base foil.

We believe that this unexpectedly high bondability was achieved due to the combined effect of the new blend of addition agents and a relatively high-current density deposition in the super-anode "zone" of the drum machine. Apparently, the combination of new blend of addition agents and the high current density produced the base foil with a matte side surface whose micro-structure, while low-profile, offers very high bondability due to the density, hardness and shape of its bonding microprojection, in short, a surface which is very adhesion-prone.

A typical "super-anode" drum machine (illustrated in FIG. 6) for the fabrication of base foil according to the present invention involves the use of a large (e.g. 2.2 meters in diameter) cylindrical drum cathode 30. Typically, the drum is constructed and mounted for clockwise rotation about its axis and its outer surface is made of titanium. The drum is adjacent to and facing toward a pair of heavy, lead (or lead-antimony alloy) curved primary anodes 31 (insoluble anodes of platinized titanium or iridium or ruthenium oxides can also be used).

The surface of the drum is separated from the anodes by an anode-drum "gap" 32 filled with plating electrolyte 33. The spacing between the edges of the two anodes provides an entry for the electrolyte which is introduced into the gap 32 through a perforated electrolyte feed pipe 34 extending along the length of the drum and circulates in the gap 32 between the outer surface of the drum and the inner surfaces of the anodes.

In addition to the two primary anodes 31, a secondary anode 35 or "superanode" is positioned at the exit side of the machine (drum rotates clockwise). A polypropylene block 36 electrically insulates the super-anode from the terminal portion of the exit-side primary anode. This insulating block is hollowed-out and contains a feed-pipe 37 that introduces supplemental fresh electrolyte (from a head tank) into a second gap 38 between the secondary anode 35 and the drum 30 and into the second electrodeposition zone. Both the drum and each of the anodes are connected electrically by heavy bus-bars 39 to one of two separate (one for primary anodes, another for secondary anode) D.C. power sources and which are illustratively rectifiers. The bus bars connect to the drum-cathode through a contact block and contact ring. As the drum rotates in the electrolyte and an electrical current is passed from the primary anodes 31 to the drum 30 through the electrolyte in gap 32 an electrodeposit of metal, e.g., copper, forms on the drum surface, and as the latter leaves the electrolyte, the electrodeposited copper is continuously stripped from the rotating drum outer surface (since the adhesion between copper electrode deposit and the drum surface is low) in the form of thin foil 40. A metal ion-containing electrolyte is pumped into the gap through one or more feed pipes 34 from a dissolving tank and the drum is at least partially immersed in the electrolyte. The foil at this stage has a matte side (the side facing the electrolyte) and a shiny side (the side facing the drum). The matte side has an improved bonding capability (as will be explained later).

Figure 6:
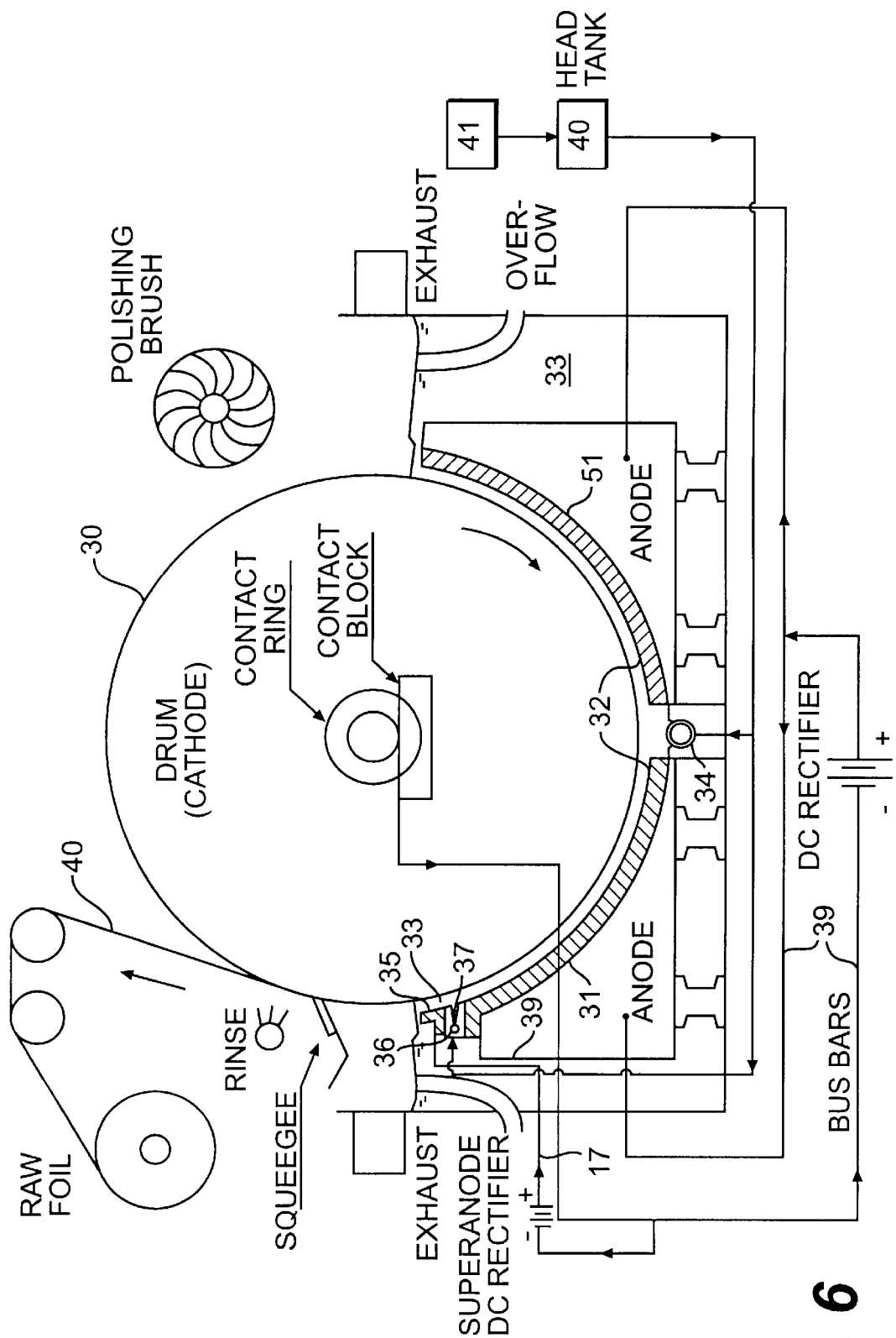
FIG. 6 illustrates apparatus for producing naw foil in accordance with the present invention.

Referring to FIG. 6, at the leading portion of drum-cathode 30, electrodeposition is effected by the passage of electric current across the electrolyte contained in the anode-cathode gap 32, an annular compartment formed between the drum-cathode and the curved primary entry and exit anodes respectively. This part of the electrolytic cell is referred to herein as the "first electrodeposition zone" or "first zone". If, as an example, the drum cathode has a 2.2 m diameter, is 1.5 m wide, and the drum-anodes distance is 1 cm, only about 45 liters of solution is subjected, at any given time, to the electrolysis. On the other hand, the electrolytic cell, which is a rectangular tank containing the body of electrolyte, the anodes, and the immersed portion of the drum, and holding about 3,000 liters of electrolyte.

Fresh electrolyte is delivered to the tank through a conduit from the head tank 40 and delivered to the anode-drum gap through a distributor pipe 34 placed between the edges of the two main anodes. The agitation of the electrolyte is by the high degree of convection that is the result of the discharge of oxygen on the surface of the anodes.

By way of example, a current of 25,000 amps generates, at the anodes, 1.4 liters of oxygen every second. The usual process at the surface of the lead anode is the discharge of hydroxyl ions (derived from dissociation of water) resulting in oxygen evolution:

$$4OH - 4E \rightarrow 2H_2O + O_2 GAS$$

This oxygen mixes intimately with the electrolyte, in the form of gas bubbles, decreases its specific gravity, creating an effect of buoyancy and an energetic upward motion lift. This effect is additionally increased by the rate at which the electrolyte is pumped into the feed-pipe 34. This gives the electrolyte contained in an annular compartment between the drum and the anodes an upward direct flow of remarkable velocity. This, in turn motivates electrolyte from the machine tank to be "sucked-in" into the gap 32 through the space between the primary or main anodes, and thus a pattern of energetic, continuous agitation in the gap is established. This mode of mass transport, in turn, allows the use of high current densities, and permits the production of economically large amounts of foil.

In an industrial scale copper foil operation, concentrations of both copper sulfate and sulfuric acid in the electrolyte should be maintained at a constant level. This is accomplished very simply. Foil producing electrodeposition machines, in terms of electrolyte supply, are a part of a continuous loop which also involves a dissolving tank (not shown) into which fresh, pure wire copper scrap is added on a continuous basis and air agitation is used to help dissolution of the scrap in the electrolyte. Electrolyte flows constantly from the dissolving tank to the plating machines where it is circulated, back to the dissolving tank and so on. In the plating machines, copper concentration tends to decrease (since copper foil is plated out) and acid concentration tends to increase, while in the dissolving tank copper concentration tends to increase back to normal due to dissolution of the scrap material and acid concentration tends to decrease since dissolution of the scrap consumes excess acid. Thus, the whole process is balanced.

The present system is equipped with a supply of aqueous solution of a combination of the above specific addition agents (inhibitors). This solution of, e.g., 5 grams inhibitor per liter (g/l), is prepared in a separate container 41, mixed with electrolyte in head tank 40, and then injected by a metering pump that supplies the machine with fresh electrolyte. The addition agents are consumed in the plating process. The addition rate is usually expressed in terms of dry weight added to the plating machine per unit of time, e.g., in milligrams per minute (mg/min). Another way of expressing the usage thereof is as a measure of the amount (weight) of dry refining agent necessary for the production of a given amount of foil endowed with necessary physical and bonding properties. In accordance with the present invention, about one kilogram of the inhibitor is typically used for the production of one metric ton of good copper foil.

The addition agents, also called refining agents or inhibitors used traditionally in copper plating and the fabrication of copper foil are not nearly "strong" enough to be instrumental in fabrication of the very low-profile, high bondability copper foil of the present invention. These traditional addition agents (gelatine, animal glue, etc.), have limited capacity of reducing grain size of the foil (and consequently foil's profile).

Figure 2:
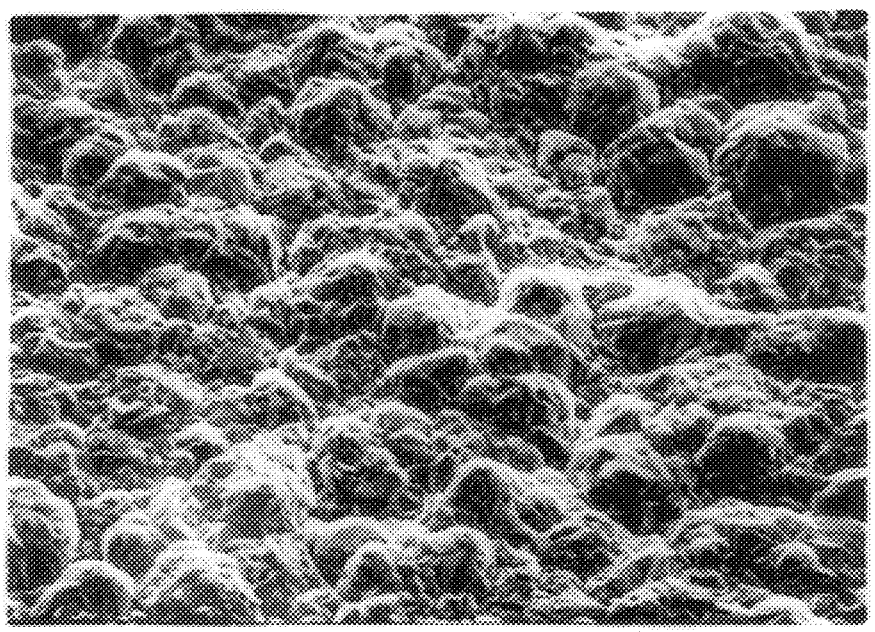
FIG. 2 illustrates the micro-topography of the matte-side surface of conventional electrodeposited copper foil.

The matte side of the foil produced with the aid of traditional addition agents is shown in FIG. 2.

As can be seen, the micro-topography of the foil consist of rather small number of high peaks. This is why we call traditional addition agents not "strong".

In sharp contrast the blend of addition agents used in the present invention has a very strong inhibition ability as illustrated in FIG. 5, from which it is seen that the number of peaks is increased by several orders of magnitude, compared to the foil shown in FIG. 2, while the individual height of the peaks is dramatically decreased.

Thus, in the first electrodeposition zone responsible for the electrodeposition of the 'core' of the foil, under the conditions of excellent mass transfer due to the high velocity of the electrolyte and moderate current density, the diffusion layer is very thin and the difference between copper concentration in the bulk of the electrolyte and the liquid-solid interface, is quite low. Copper, plated under such conditions and furthermore in the presence of addition agents, has a micro-structure that consists of fine grained and densely packed, base-oriented crystallites. As a result of such microstructure the core of the foil is endowed with excellent mechanical and metallurgical properties, indispensable in printed circuit industry. The outer surface of the 'core' is composed of dense, conical, micro-peaks and micro-valleys.

According to the present invention, supplemental fresh electrolyte introduced into the succeeding second electrodeposition zone through a second distributor pipe 37, and the electrolyte is the same as in the first zone the current density in the second zone is some three times higher than that in the first zone, which results in a poor mass transfer. Accordingly, such conditions encourage electrodeposition of field-oriented micro-structures deposited densely over the micro-peaks of the surface of 'core' deposit formed in the preceding (first) electrodeposition zone. Under such conditions, and furthermore, in the presence of the addition agents, the copper electrodeposit consists of dense, spherical micro-projections, distributed densely over the micro-peaks of the surface of the 'core' deposit formed in the preceding (first) electrode position zone. This coating of spherical micro-projections constitutes a 'bonding treatment' on the matte side of the foil, since it greatly enhances surface area available for bonding to the polymeric materials. In other words, the second electrodeposition zone produces on the matte side of the foil a deposit characterized by a roughness factor (a ratio of the true area to the apparent area) that is best for bonding copper foil to the polymeric substrates. As a summary, it can be said that in the two electrodeposition zones the growth of two very different electrodeposits (in terms of their micro-structure), having two different functions is achieved by arranging and maintaining in each zone different mass transfer conditions, particularly current densities. Due to the above differences in and due to the presence of particular refining agents, very different microstructures of the deposit are obtained in each zone even though the electrolyte in both zones is the same.

Most importantly, the present invention also takes advantage of anomalous behavior of refining agents with respect to the influence these agents have on the microstructure and therefore on the properties and functional applications of electrodeposits, depending on the current density of the process.

The present combination of refining agents in combination with excellent mass transfer conditions (as represented by J/Jdl ratio) in the first electrodeposition zone diminish the grain size of the deposit and thus help to produce base oriented, fine grained and compact electrodeposit—in short, a structure which assures that the properties and functions of the 'core' of the foil (formed in first electrodeposition zone) are very good. On the other hand, refining agents combined with poor mass transfer conditions, as in the second electrodeposition zone, help to produce field oriented micronodular deposits whose individual particles project outward from the surface of the foil and are micro-spherical in shape. Such spherical microdeposits function excellently as a 'bonding treatment' between copper foil and polymeric substrates.

Figure 7:
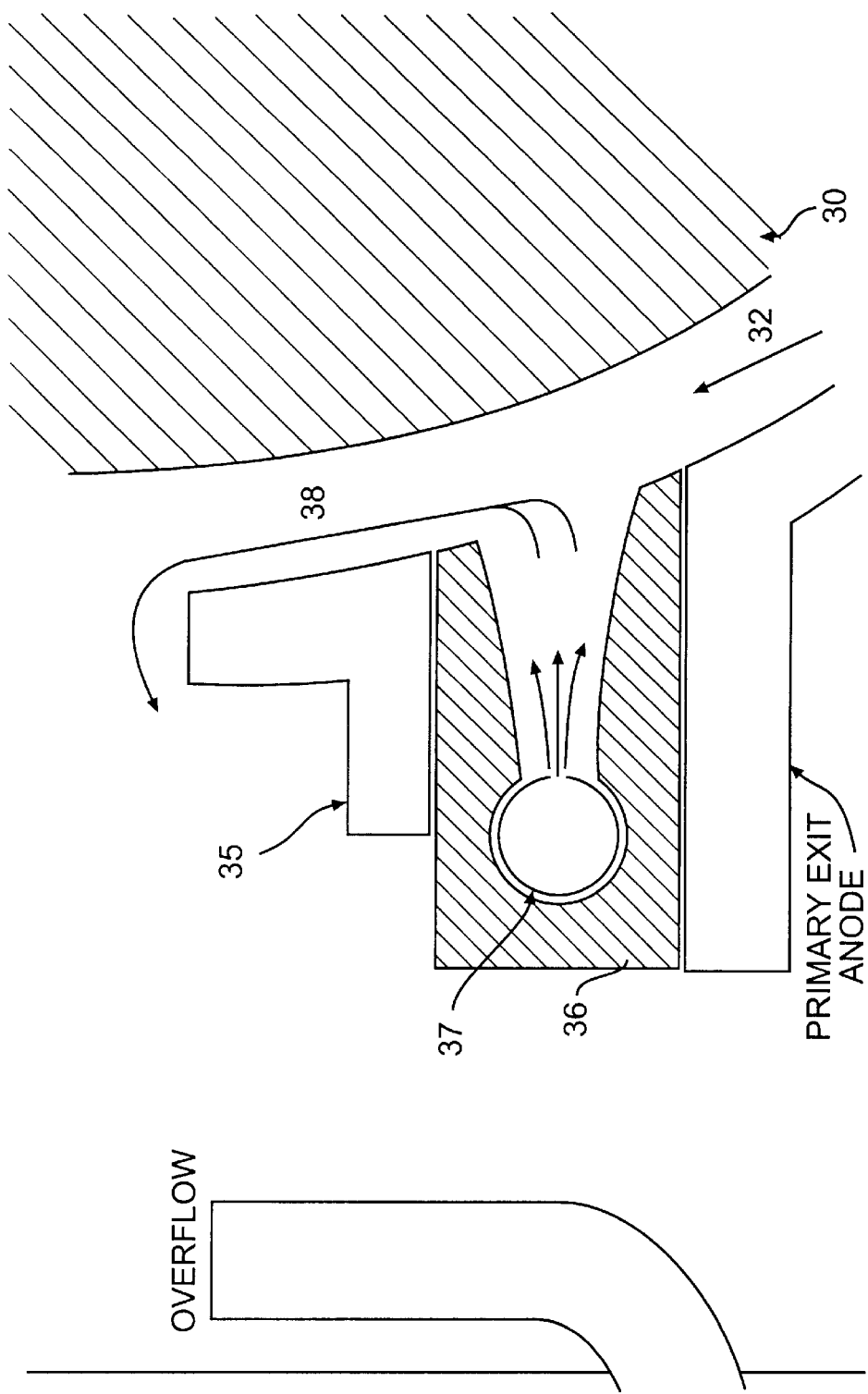
FIG. 7 illustrates the second electrodeposition zone shown in FIG. 6.

In FIG. 6 the terminal portion of primary exit anode 31 is spaced apart and electrically insulated from secondary anode 35 (super-anode) FIG. 7 shows this portion of the machine, the second electrodeposition zone, in greater detail. Supplemental fresh electrolyte from the head tank with the blend of four addition agents contained in this electrolyte is introduced into the gap 38 using a feed pipe or a distributor 37 which is positioned between the top portion of the exit primary anode and the bottom portion of the secondary anode. The distributor is formed, e.g., of a perforated pipe located in a hollowed out block 36 of a suitable plastic such as polypropylene.

In the second electrodeposition zone the volumetric feed rate of the supplemental fresh electrolyte brings a supply of copper ions to replace the ions "lost" due to the electrodeposition, and thus maintain the desired level of copper concentration. The flow of supplemental fresh electrolyte also brings the supply of the addition agents which also are consumed in the plating process.

Summarizing, the present invention employs the use of the above blend of specific addition agents added into copper plating electrolyte and a moderate current density in the first electrodeposition zone and the same copper plating electrolyte with the same addition agents, but with much higher current density, in the second electrode position zone.

Thus, the bulk of the foil (the core) is deposited under the conditions of good mass transfer (thin diffusion layer). Due to the presence of addition agents selected for their ability to drastically reduce grain size of the electrodeposit, the core of foil deposited in the first electrodeposition zone is composed of small and very densely packed grains, and its outer surface consists of a multitude of very regular, densely packed micro-peaks and micro-valleys, with micro-peaks not exceeding 150 micro-inches in height.

The copper deposited in the second electrodeposition zone (opposite the super-anode), has a different structure due to the fact that mass transfer conditions are not nearly as good as in the first zone. With the current density in the second zone being some three times higher than in the first zone, the diffusion layer is much thicker than in the first zone. That in turn encourages formation of field oriented deposits. Thus the matte surface created in the second electrodeposition zone has the characteristics of the bonding treatment i.e., the surface composed of dense microprojections that greatly enhance the true surface area available for bonding to the polymeric substrates.

A typical raw foil according to the present invention has a peel-strength of about 10 lbs/inch and the roughness of the matte side (Rz) does not exceed 200 microinches (5 microns).

Figure 8:
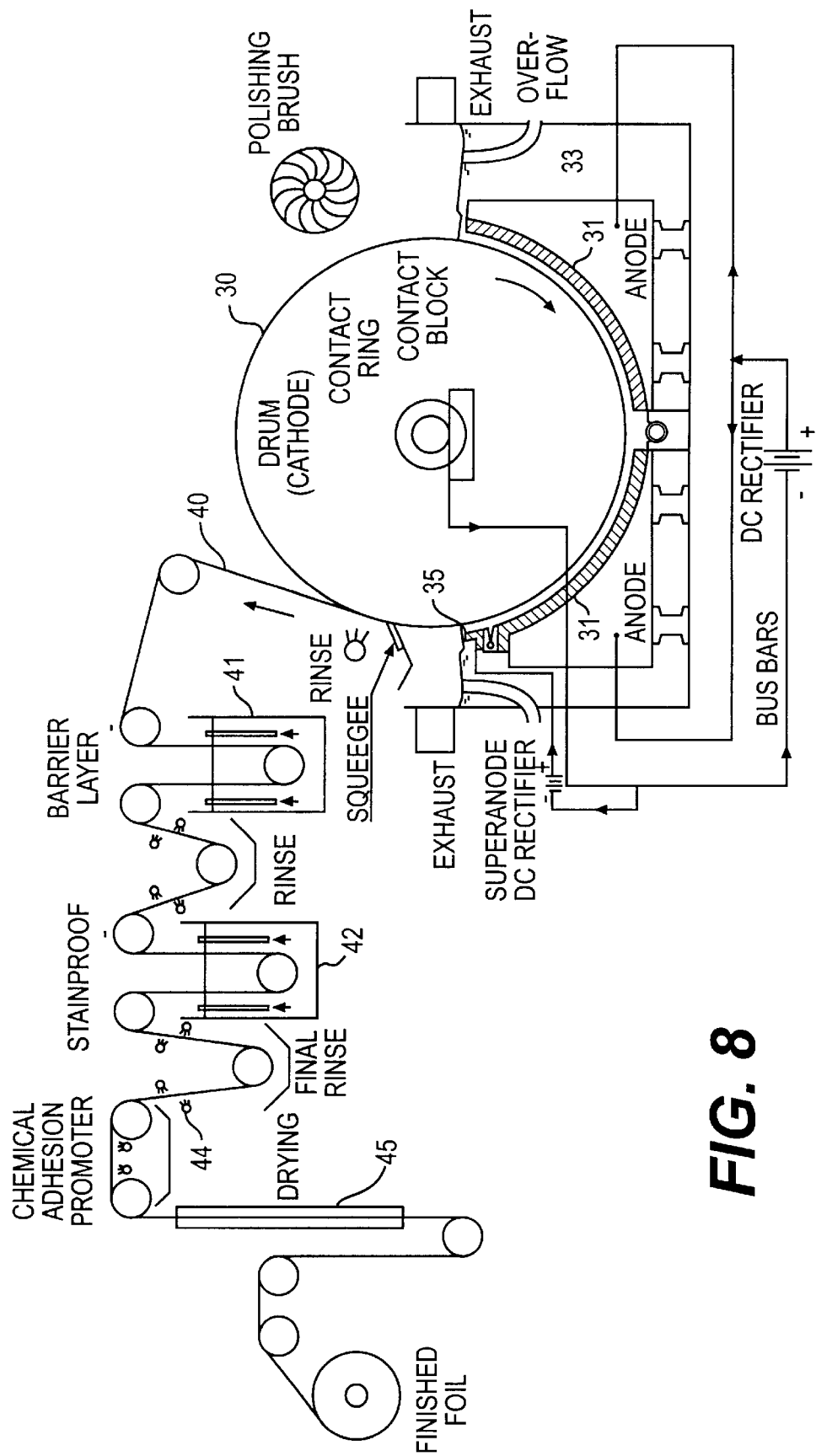
FIG. 8 illustrates a preferred machine for producing finished foil in accordance with the present invention.
Figure 9:
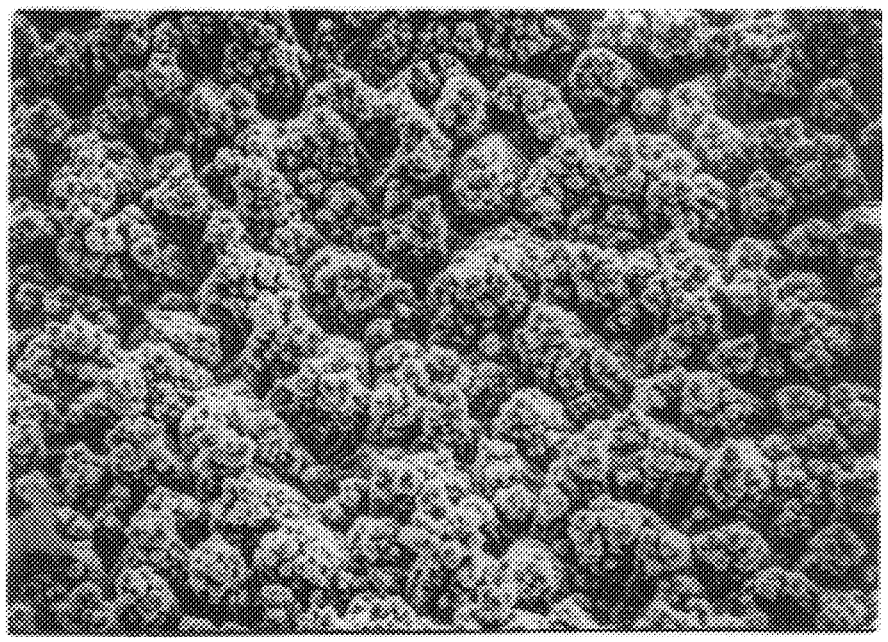
FIG. 9 is a microphotograph of the matte side of conventional copper foil having a traditional treatment applied thereof.

The raw foil electrodeposited in the manner described above may be subsequently processed through a simple and compact treater machine preferably in an economical one-step process, as shown in FIG. 8.

As illustrated in FIG. 8, foil 40 made in accordance with the present invention is passed directly from the drum 30, rendered cathodic by means of contact rollers and passes in a serpentine fashion through a barrier layer tank 41, a stainproofing tank 42 and appropriate rinse stations. Each tank has its own supply, respectively, of an appropriate barrier layer electrolyte, stain-proofing electrolyte and its direct current power source.

The purpose of this operation is to deposit on the matte side of the raw foil a barrier layer of zinc as described in U.S. Pat. No. 3,857,681, which is incorporated herein by reference. Alternately, a zinc-antimony-nickel barrier can be deposited, as described in U.S. Pat. No. 4,572,768, which is incorporated herein by reference.

The zinc, or zinc-antimony-nickel deposition is followed by the electrolytic application on the barrier layer of the stain-proof layer conducted in the aqueous solution of chromium salts, e.g., according to U.S. Pat. No. 3,625,844, which is incorporated herein by reference.

An electrolytic stainproofing conducted in the solution of chromium and zinc salts can also be used, as described in U.S. Pat. No. 5,447,619, which is incorporated herein by reference.

After the application of the stain-proof and the subsequent water rinse the foil is subjected (bonding or matte side) to the spray 44 of an aqueous solution of an adhesion promoter, which is not rinsed off, but it's dry residue, after the water is evaporated in the drying tunnel 45, remains on the bonding side of the foil, in order to increase its peel-strength, by enhancing chemical aspects of adhesion, as distinct from mechanical adhesion which depends on micro-roughness of the surface destined for bonding. Bonding treatment on the matte side of the foil is an example of creating a micro-rough surface to promote it's "bondability" by mechanical means (mechanical interlocking) because, obviously, a rough surface will have a larger potential bonding area than a smooth one.

While there are many theories that explain the mechanism of chemical adhesion, the adsorption theory seems to be the most applicable to the technology of copper clad laminates for PCB's. It states that, "providing intimate molecular contact is achieved at the interface, the materials will adhere because of the interatomic and intermolecular forces which are established between the atoms and molecules in the surfaces of adhesive and substrate." Such interfacial bonds, however, are dependent on mechanical adhesion.

Various adhesion promotions are well known, and in the copper foil industry, the most frequently used are silane-based primers, particularly glycidoxy silane, usually called epoxy silane. Other organometallic primers (organotitanates, organozirconates) can also be used, as well as 2-mecaptoimidazole base primers and benzotriazole primers, and chrome complexes and the interfacial chemical component is, thus, an important factor.

When a typical foil according to the present invention is subjected to the surface treatment that consists of the application of a barrier layer, stain-proof and adhesion-promoter, the initial peel-strength of 10 lbs/inch increases to 12 lbs/inch.

All these steps, executed by passing the base foil through the treating machine as illustrated at FIG. 8, contribute toward chemical aspects of adhesion, and none of these steps changes the micro-roughness of the bonding side of the foil.

According to our invention, the micro-roughening steps of the bonding treatment accomplished by passing the foil through a traditional treater machine, can be advantageously replaced by producing base foil on the rotating-drum machine as shown in FIG. 6, and introducing the mixture of certain addition agents described above into the copper plating electrolyte.

Copper foil produced in such a manner has a matte (or bonding) side characterized by micro-roughness which is actually as good or better than the micro-roughness provided by the micro-roughness stations of the traditional treater.

Consequently, the base foil produced according to this invention requires only application of barrier layer, stain-proof and adhesion-promoter. These simple steps are provided by a very short and inexpensive, treater machine as shown in FIG. 8.

The improved results obtained in the practice of the present invention can be explained as follows.

The use of the blend of special addition agents, combined with the moderate current density in the first electrodeposition zone creates the core of the foil whose exterior (matte) surface is composed of micro-peaks and microvalleys. The number of micro-peaks per surface area is several orders of magnitude greater than the number of peaks per surface area of the foil produced with the traditional addition agents.

The individual height of the peaks produced with the aid of the special addition agents is about two times lower than the peaks resulting from the traditional process.

When such a micro-profile is exposed to the high current conditions of the second electrodeposition zone, the deposit formed in that zone is a form of spherical micro-projections which are very uniformly distributed over a great number of small peaks produced in the first electrodeposition zone.

Excellent bondability is achieved, not by the excessive height of relatively low number of micro-projections (as in the traditional process), but by the great number of relatively low micro-projections; thus, the combination of good bondability and low profile is accomplished (compare FIG. 2, FIG. 5 & FIG. 3(A)–3(D).

In the practice of the present invention, the unique combination of the applied current densities, and the use of special inhibitors, as described above, creates the conditions for the production of core foil having a superior bonding treatment and the resulting low profile matte height not greater than about 200 microinches.

Separately, the above factors do not achieve such results. For example—in the presence of special addition agents in the copper plating electrolyte, just by itself, helps in creating of the smooth matte side, with little bonding ability, while high current density, just by itself, in the second zone at the end of the foil making process causes formation of a too prominent matte height if addition agents of a sufficient number of particular different species and concentration are not used.

Aside from the obvious economic advantages that the elimination of steps offers over the traditional foil making and treatment process, the present invention also offers an advantage in terms of quality. The described drum-treatment, due to its low-profile and the absence of breaking off, or transfer, of the nodules, or microprojections, is better than the traditional treatment.

Since the actual height of the micro-topography of the bonding side of the foil is typically lower than 200 $\mu$m, the actual time necessary to etch away unwanted foil to form a desired circuit configuration on the printed circuit board is shortened considerably, as compared to the standard foil, and the dielectric properties of the board are improved.

The present low profile foil provides a desirable cross-section which is closer to rectangular-shaped cross-section of the fine circuit lines. This, in turn, will give better line definition, improved layer to layer dielectric thickness in the fabrication of multi-layer printed circuit board, and the better dimensional stability of the boards.

The above-described techniques produce a copper foil which, when laminated to a prepreg, has improved peel strength by combining interlocking between the foil and the prepreg, with chemical enhancement of the adhesion between the metal and the polymer of the prepreg. This is different from the conventional situation when all the peel strength is achieved by mechanical interlocking.

Figure 3A:
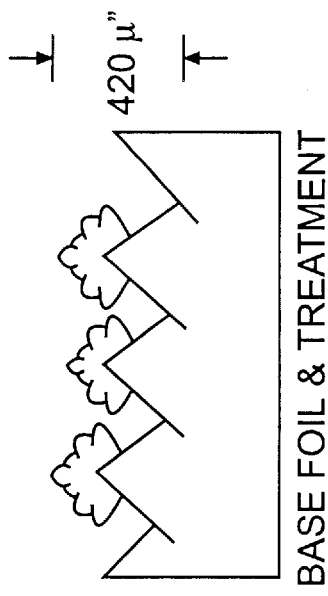
FIGS. 3(A)–3(D) illustrates the micro-topography of the matte-side surface of conventional foils to those of the present invention.
Figure 3B:
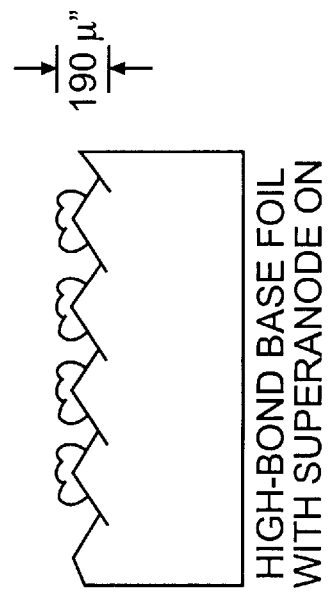
Figure 3C:
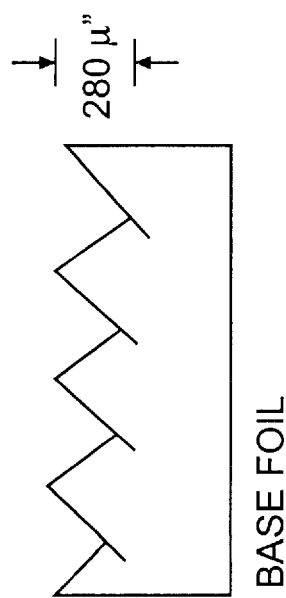
Figure 3D:
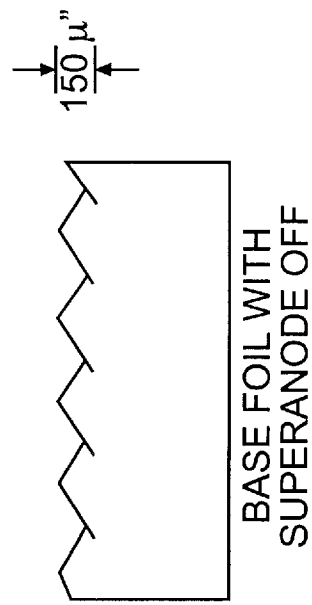

Traditional bonding treatment profits very little or not at all from the application of chemical adhesion promoter such as epoxy silane. This is because even the well executed traditional bonding treatment is mechanically fragile due to the overcrowding of the peaks of the base foil. FIG. 3(B) shows that the individual particles of the treatment are very complex in shape and thus lack a high degree of mechanical integrity. Since the bonding treatment becomes a part of the interface with the polymeric substrate when copper clad laminate is produced, the overly complex micro-roughness of the bonding treatment followed by the application of the layer of epoxy silane, a weak layer on the interface is created and that in turn has a negative effect on the chances of increasing peel-strength by chemical means.

As opposed to the traditional treatment, the bonding side of the foil produced according to this invention is compact and resilient in mechanical terms. Consequently, the application of adhesion promoter onto the bonding treatment does not result in creation of the weak layer at the interface, thus the peel-strength is increased, combining mechanical and chemical aspects of adhesion.

Based upon our experimental work, it is preferred to carry out the process of the present invention using the electrolyte, grain refining agents and plating parameters described below:

| ELECTROLYTE: Copper/sulfate/sulfuric acid | | |
|---|---|---|
| | Most Preferred | Preferred Range |
| Cu (as metal) concentration | 90 g/l | 60–110 g/l |
| $H_2SO_4$ | 100 g/l | 40–150 g/l |
| temperature | 150° F. | 100° F.–180° F. |

Preferred Ranges of Addition Agents Stock Solution hydroxyethyl cellulose—5.0–10.0 gl polyethylene imine—0.1–2.0 g/l poly (ethylene glycol) ether average m.w. 2000—0.25–3.0 g/l 2-mercaptpethane sulfonic acid sodium salt—0.1–0.4 g/l Most Preferred Addition Agents Stock Solution hydroxyethyl cellulose—5 g/l polyethylene imine—0.5 g/l poly (ethylene glycol) ether average m.w. 2000—0.5 g/l 2-mecraptoethane sulfonic acid sodium salt—0.25 g/l Addition rate—most preferred—600 mg/min (expressed as dry weight) preferred range—200–1000 mg/min.

Plating Parameters

Fresh Electrolyte Feed Rate 1. into gap between drum and primary anodes most preferred—120 l/min preferred range—50–200 l/min 2. into gap between drum and secondary anode most preferred—40 l/min preferred range—20–100 l/min 3. current density (direct current) primary anodes most preferred—50 amps per square decimeter preferred range—20–100 A/DCM$^2$ 4. current density (direct current) secondary anode most preferred—200 A/DCM$^2$ preferred range—100–300 A/DCM$^2$ A 1 oz. copper foil was made in accordance with the present invention on a "super-anode" drum plating machine and employing the most preferred plating parameters, addition agents and electrolyte described above.

The foil was then provided with the barrier layer, stain-proofed and sprayed with glycidoxy silane.

FIG. 5 is a photomicrograph (1000×), taken at an incident angle of 45°, showing the matte (bonding) surface of the resulting foil. The resulting foil was then laminated to an epoxy/glass fiber prepreg and the peel strength was measured and found to be 12 lbs/inch.

Having described preferred embodiments of the invention, it will be understood that variations and modifications thereof falling within the spirit of the invention may occur to those skilled in the art, and the scope of the invention is to be determined by the appended claims and their equivalents.

What is claimed is:

1. An electrolytic process for producing copper foil having a low profile surface exhibiting a high peel strength when bonded to a polymeric substrate, which process comprises:

(a) preparing an electrolyte comprising a copper sulfate-sulfuric acid solution, said solution having added thereto minor amounts of a low molecular weight water-soluble cellulose ether, a low molecular weight water-soluble polyalkylene glycol ether, a low molecular weight water-soluble polyethyleneimine and a water-soluble sulfonated organic sulfur compound;

(b) passing a direct electric current through the electrolyte from a primary anode to a cathode spaced from the primary anode in a first electrodeposition zone under first mass transfer conditions including a first current density to electrodeposit on the cathode a base copper foil having a fine-grained microstructure and a matte surface having micropeaks with a height not greater than about 150 microinches;

(c) passing the base foil and electrolyte from the first electrodeposition zone to a second electrodeposition zone; and (d) passing a direct electric current through the electrolyte from a secondary anode to the cathode spaced from the secondary anode under second mass transfer conditions including a second current density greater than the first current density and which provide a mass transfer poorer than that in the first electrodeposition zone, while introducing into the second electrodeposition zone a supplemental stream of the electrolyte, to electrodeposit on the matte surface micronodules of copper, so as to produce a copper foil having a total matte height not greater than about 200 microinches.

2. The process of claim 1, wherein the cathode is a rotating drum immersed in the electrolyte, the electrolyte is supplied from below the cathode and introduced into a first gap between the cathode and the primary anode, the secondary anode is positioned above the primary anode at an exit end and spaced from the cathode, the supplemental electrolyte is introduced into a second gap between an upper end of the primary anode and a lower end of the secondary anode.

3. The process of claim 2, wherein the electrolyte is fed into the first gap at a rate of about 50–200 l/min; and the supplemental electrolyte is fed into the second gap at a rate of about 20–100 l/min.

4. A copper-clad laminate comprising the copper foil defined by claim 3 laminated to a polymeric substrate.

5. The process of claim 3, wherein the first current density is 20–100 A/DCM$^2$, and the second current density is 100–300 A/DCM$^2$.

6. The process of claim 5, wherein the fresh electrolyte is formed by adding to an aqueous copper sulfate-sulfuric acid solution an aqueous addition agent stock solution containing the following addition agents: 2–10 g/l hydroxyethyl cellulose; 0.2–1 g/l polyethylene amine; 0.1–1 g/l polyethylene glycol ether; and 0.1–0.5 g/l 2-mercaptoethane sulfonic acid sodium salt, and the addition agents are added to the copper sulfate-sulfuric acid solution at an addition rate of 200–1000 mg/min.

7. The process of claim 2, wherein the electrolyte in the first gap is agitated by oxygen evolved from the electrolyte.

8. The process of claim 1, wherein the electrolyte comprises:

60–110 g/l copper;

40–150 g/l $H_2SO_4$;

2–10 g/l cellulose ether;

0.2–1.0 g/l polyalkylene glycol ether;

0.2–1.0 g/l polyethyleneimine; and 0.1–0.5 g/l sulfonated organic sulfur compound.

9. The process of claim 1, wherein the cellulose ether is a hydroxyethyl cellulose ether, the polyalkylene glycol ether is selected from the group consisting of polyethylene glycol monoethyl and dimethyl ethers; the polyethyleneimine is selected from the group consisting of polyethyleneimines having a molecular weight of from about 250 to 1800; and the sulfonated organic sulfur compounds are selected from the group consisting of aliphatic and aromatic compounds having an average molecular weight of from about 100 to 600.

10. The process of claim 1, further including applying to the produced foil at least a zinc-containing barrier layer and a chromium-containing stain-proofing layer.

11. The process of claim 9, wherein the produced foil is passed directly from the second electrodeposition zone to, in sequence, at least a barrier layer applying station and, a stain-proofing applying station.

12. Copper foil produced by the process defined by any one of claims 1–10.

13. An electrolytic process for producing copper foil, comprising passing an electric current through an electrolyte from an anode spaced from a cathode to electrodeposit copper foil on the cathode, wherein said electrolyte comprises a copper sulfate-sulfuric acid solution having added thereto minor amounts of a low molecular weight water-soluble cellulose ether, a low molecular weight water-soluble polyethylene glycol ether, a low molecular weight water-soluble polyethyleneimine, and a water-soluble sulfonated organic sulfur compound.

* * * * *

UNITED STATES PATENT AND TRADEMARK OFFICE
CERTIFICATE OF CORRECTION

PATENT NO. : 5,863,410
DATED : January 26, 1999
INVENTOR(S) : Charles B. Yates et al.

It is certified that error appears in the above-identified patent and that said Letters Patent is hereby corrected as shown below:

Claim 11, col. 22, line 4, "Claim 9" should read --claim 10--.

Signed and Sealed this

Seventh Day of September, 1999

Attest:

Q. TODD DICKINSON

*Attesting Officer*   *Acting Commissioner of Patents and Trademarks*